(12) United States Patent
Bae

(10) Patent No.: US 7,143,258 B2
(45) Date of Patent: Nov. 28, 2006

(54) METHOD AND DEVICE FOR MASKING RINGING IN A DDR SDRAM

(75) Inventor: Sung Ho Bae, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 267 days.

(21) Appl. No.: 10/737,296

(22) Filed: Dec. 16, 2003

(65) Prior Publication Data

US 2005/0015560 A1    Jan. 20, 2005

(30) Foreign Application Priority Data

Jul. 15, 2003    (KR)  .................... 10-2003-0048228

(51) Int. Cl.
*G06F 12/00* (2006.01)
(52) U.S. Cl. .................... 711/167; 365/233
(58) Field of Classification Search ................ 711/167
See application file for complete search history.

(56) References Cited

U.S. PATENT DOCUMENTS 6,134,179 A * 10/2000 Ooishi .................... 365/233
6,560,669 B1 * 5/2003 Ryan .................... 711/105
2004/0052151 A1 * 3/2004 Jacobs et al. ............ 365/233
2004/0268028 A1 * 12/2004 Lee .................... 711/105

FOREIGN PATENT DOCUMENTS

KR    2005002521 A  *  6/2005

* cited by examiner

*Primary Examiner*—Brian R. Peugh
*Assistant Examiner*—Hashem Farrokh
(74) *Attorney, Agent, or Firm*—Ladas & Parry LLP

(57) ABSTRACT

A DDR SDRAM operates at a double data rate by accessing the bursts of data having a burst length in accordance with the rising and falling edges of each pulse of a DQS signal. A ringing may occur in the DQS signal causing write failures. To mask the ringing, a DQS buffer generates a first access signal at the rising edge of each DQS pulse generated in presence of the data burst. The DQS buffer also generates a second access signal at the falling edge of each DQS pulse. Each of the first and second access signals includes a finite number of pulses based on the total number of rising and falling edges of the DQS signal. Two consecutive data bursts are accessed together for a write operation for each pair of the consecutive first and second access signals. After accessing all data bursts, a mask time is calculated to disable the DQS buffer, by which the ringing is masked.

31 Claims, 4 Drawing Sheets

METHOD AND DEVICE FOR MASKING RINGING IN A DDR SDRAM

BACKGROUND OF THE INVENTION

1. Field of the Invention

The present invention relates generally to preventing write fails in a memory device including a Double Data Rate Synchronous Dynamic Random Access Memory (DDR SDRAM), and more particularly to preventing write fails that are caused by a ringing in a DQS signal applied to a DDR SDRAM during a write operation.

2. Description of the Prior Art

In general, a Double Data Rate Synchronous Dynamic Random Access Memory (DDR SDRAM) operates at a double speed when compared to the frequency of a clock (clk) signal, because a DDR SDRAM latches or accesses (e.g., reads and writes) data at both the rising and falling edges of a DQS signal during a write operation. In general, the controller of a DDR SDRAM provides the DQS signal (among other signals) during, for example, a write operation, and this DQS signal—at both rising and falling edges—is used to clock data into the DDR SDRAM in a write operation (and into the controller in a read operation). Consequently, a DDR SDRAM is said to operate at a double data rate.

This double data rate operation utilizing the rising and falling edges of the DQS signal is usually performed only in the input/output buffers of a DDR SDRAM. The internal operations of a DDR SDRAM, like operations of SDRAM, are performed at an interval of one clock. For example, all control signals may change only on the rising edge of the clk signal.

For the double data rate operation in a DDR SDRAM, two signals dsrt2 and dsft2 are generated based on the rising and falling edges of one pulse of the DQS signal. Data are latched at the rising edge of each of dsrt2 and dsft2 signals for the double data rate operation.

A conventional write operation of the DDR SDRAM is described with reference to FIGS. 1A–1B and 2.

Shown in FIG. 1A is a block diagram of a data input part showing the write operation of a DDR SDRAM. A DQS buffer 100 receives and buffers the DQS signal for use within the DDR SDRAM. The DQS buffer 100 outputs the signal to a DQS latch 110, which receives and latches the signal outputted by the DQS buffer 100.

A Din buffer 120 as a data input buffer receives and buffers the data DQ signal. A Din latch 130 as a data latch receives and latches the data DQ signal transferred from the Din buffer 120.

A Din IOSA 140 is an amplifier for detecting the data input/output. The Din IOSA 140 receives and amplifies the received data outputted by a Din latch 130, and then transfers the amplified data to the input/output lines gio_e, gio_o. A data input strobe pulse (dinstbp) signal as shown in FIG. 1A enables the Din IOSA 140.

Shown in FIG. 1B is a timing chart for illustrating a general write operation in a DDR SDRAM. The abbreviation "clk" is an external clock signal; "DQ" is an external input data; "algn_r" and "algn_f" are data that are latched and aligned at the falling edge of the DQS signal (i.e., a rising edge of dsft2); "dinstbp" is a signal utilized for latching the data algn_r, algn_f that are aligned in the data latch at the rising edge of dsft2 and for transferring the latched data to the global input/output bus lines; and "gio_e" and "gio_o," respectively, are the even and odd global bus lines to which the data from the DDR SDRAM are transferred. "1st_r", "1st_f", "2nd_r", and "2nd_f" (a burst length equals 4) represent the data that are inputted to the global bus lines.

Now referring to both FIGS. 1A and 1B, a DDR SDRAM write operation is described here. A "write" command (FIG. 1B) can be issued in synchronization with a clock signal (clk) applied from an external source. After a predetermined time delay, the DQS signal is applied to the DQS buffer 100 as shown in FIG. 1B. The DQS latch 110 receives the DQS signal from the DQS buffer 100 and generates dsrt2 and dsft2 signals. The dsrt2 and dsft2 are pulse signals generated in synchronization with the rising and falling edges of the DQS signal, respectively.

The data 1st_r, 1st_f, 2nd_r, and 2nd_f in the DQ signal are serially inputted to the data buffer 120 and are stored in the data latch 130 in synchronization with the rising and falling edges of the DQS signal. For example, the first data 1st_r is stored in the data latch 130 in synchronization with the rising edge of the dsrt2 signal, and a second data 1st_f is stored in the data latch 130 in synchronization with the rising edge of the dsft2 signal. The data 1st_r and 1st_f stored in the data latch 130 are then aligned in synchronization with the falling edge of the DQS signal (i.e., the rising edge of the dsft2 signal). They are then inputted to the Din IOSA 140. In FIG. 1B, the data aligned in synchronization with the falling edge of the DQS signal and are inputted to the Din IOSA 140 are represented as 1st_algn_r, 1st_algn_f, 2nd_algn_r, and 2nd_algn_f.

Next, the data 1st_algn_r, 1st_algn_f, 2nd_algn_r, and 2nd_algn_f stored in the Din IOSA 140 are transferred to the global input/output bus lines gio_e and gio_o in presence of the data input strobe pulse signal dinstbp, which enables the Din IOSA 140 operations.

As shown in FIG. 1B, the same above-mentioned operations are repeated in synchronization with the rising and falling edges of each of the second and subsequent pulses of the DQS signal.

After finishing the write operation, the DQS signal returns to a high-impedance state after the completion of a post-amble.

However, now referring to FIG. 2, in a case where a ringing is present after the postamble, the $2^{nd}$_algn_r and $2^{nd}$_algn_f data, which have been stored and aligned in the Din latch 130 in synchronization with the falling edge of the last pulse of the-DQS signal (e.g., the second pulse of the DQS signal of FIG. 1), are substituted with wrong data in synchronization with the rising and falling edges of the erroneous DQS signals corrupted by the ringing. Such a malfunction caused by a ringing is shown in FIG. 2.

As described, a ringing can be generated to corrupt the DQS signal in a write operation when the DQS signal reaches a high-impedance state after completing a normal operation based on the uncorrupted DQS signal.

In general, a write failure caused by the presence of a ringing in the DQS signal in a write operation is not always generated in all motherboards. However, the write failure tends to increase as the number of memory module slots on the motherboard increases, as the clock frequency increase, and so forth as the failure may be dependent on various different development techniques utilized in developing a DDR SDRAM.

Therefore, the conventional DDR SDRAM has a problem, in that a conventional DDR SDRAM would regard the ringing present in the DQS signal as a part of the normal DQS signal and thereby would latch the wrong data at the rising and falling edges of the ringing. As a result for example and as shown in FIG. 2, the last two data 2nd_algn_r and 2nd_algn_f stored in the data latch are corrupted and the corrupted wrong data-are then transferred to the global input/output lines.

SUMMARY OF THE INVENTION

Accordingly, the present invention has been made to solve the above-mentioned and other problems related to the prior art. An object of the present invention is to provide a method and device for masking ringing in a Double. Data Rate Synchronous Dynamic Random Access Memory (DDR SDRAM) by controlling a DQS buffer to prevent a DQS signal corrupted by a ringing from passing the DQS buffer.

In order to accomplish this object according to an aspect of the present invention, a method is provided for masking a ringing in a DDR SDRAM. A DQS signal is received by a DQS buffer, and a plurality of data are received by a data input buffer. The DQS signal outputted from the DQS buffer is stored in a DQS latch. A first signal is generated in synchronization with a rising edge of the DQS signal. A second signal is generated in synchronization with a falling edge of the DQS signal. A first data out of the plurality of data outputted from the data input buffer is stored in a data input latch in synchronization with a rising edge of the first signal. A second data out of the plurality of data outputted from the data input buffer is stored in the data input latch in synchronization with a rising edge of the second signal. The first and second data stored in the data input latch are transferred to a data input/output detection amplifier in synchronization with a falling edge of the second signal. A point in time at which the burst length ends is determined, and then an operation of the DQS buffer is controlled based on the determined point in the time at which the burst length has ended.

In addition, a first pulse signal is generated when a write command is issued, and a first to a fourth write burst signal are generated according to the first pulse signal and the burst length. The first burst signal is enabled during the burst length. A second pulse signal is generated in synchronization with a clock signal of the DDR SDRAM while the first write burst signal is enabled. A third pulse signal is generated for disabling the first write burst signal according to the burst length by a combination of the first and second pulse signals. A fourth pulse signal for disabling the operation of the DQS buffer is generated in synchronization with the second signal after the first write burst signal is disabled. The fourth pulse signal using the second to fourth write burst signals disables the DQS buffer to mask the ringing.

In the method according to the present invention, the first write burst signal is enabled by the first pulse signal during the burst length, the second write burst signal is a signal obtained by delaying the first write burst signal by one half period of the clock signal, the third write burst signal is a signal obtained by delaying the second write burst signal by one half period of the clock signal, and the fourth write burst signal is a signal obtained by delaying the third write burst signal by one half period of the clock signal.

In order to accomplish the above object according to another aspect of the present invention, there is provided a device for masking ringing in a DDR SDRAM. The device includes means for performing a write operation; and means for determining a point in time at which a burst length ends and thereby controlling the operations of the DQS buffer based on the determined point in time, when a write command is issued.

The means for performing a write operation includes a DQS buffer for receiving a DQS signal; a DQS latch for storing the DQS signal outputted from the DQS buffer; a data buffer for receiving data; a data latch for storing the data transferred from the data buffer; and a data input/output detection amplifier for receiving the data stored in the data latch and transferring the received data to global input/output lines.

Here, the means for controlling the operations of the DQS buffer comprises a write command decoder, a write burst generator, an internal write generator, a burst length counter, and a a DQS controller.

The write command decoder generates a first pulse signal when the write command is issued. The write burst generator generates a first to a fourth write burst signal according to the first pulse signal and the burst length. The first write burst signal is enabled during the burst length.

The internal write generator generates a second pulse signal in synchronization with a clock signal of the DDR SDRAM while the first write burst signal is enabled. A burst length counter generates a third pulse signal, which disables the first write burst signal according to the burst length, by a combination of the first and second pulse signals. The DQS controller generates a fourth pulse signal, which controls the operation of the DQS buffer, in synchronization with a falling edge of the DQS signal after the first write burst signal is disabled.

It is preferred that the write burst generator has a function of receiving the second pulse signal to count the third pulse signal.

According to further another aspect of the present invention, there is provided a device for masking ringing in a DDR SDRAM. The device includes means for performing a write operation; and means for generating a control signal which determines a point of time at which a burst length ends to disable the operation of the DQS buffer based on the point of the time determined and normally recovers the operation of the DQS buffer after the elapse of a predetermined time, when a write command is issued.

The means for performing a write operation includes a DQS buffer for receiving a DQS signal; a DQS latch for storing the DQS signal outputted from the DQS buffer; a data buffer for receiving data; a data latch for storing the data transferred from the data buffer; and a data input/output detection amplifier for receiving the data stored in the data latch and transferring the received data to global input/output lines.

According to yet another aspect of the invention, a memory device including a DDR SDRAM that operates at a double data rate by accessing the bursts of data (DQ) having a burst length (n) in accordance with the rising and falling edges of each pulse of a DQS signal. The DDR SDRAM has a device for masking a ringing that corrupts the integrity of the DQS signal causing write failures comprising a DQS buffer (330) and means for disabling the DQS buffer (330).

The DQS buffer (330) generates a first access signal (dsrt2) substantially in synchronization with the rising edge of each DQS pulse generated in presence of the data burst (DQ). The DQS buffer (33) also generates a second access signal (dsft2) substantially in synchronization with the falling edge of each DQS pulse generated in presence of the data burst (DQ).

The first access signal (dsrt2) includes a finite number of pulses based on the total number of rising edges of the DQS signal, and the second access signal (dsft2) includes a finite number of pulses based on the total number of falling edges of the DQS signal. Two consecutive data bursts are accessed together for a write operation for each pair of the consecutive first and second access signals (dsrt2, dsft2).

The means (300, 310, 320, 340, 350) disables the DQS buffer for a mask time (dsb) after accessing all data bursts. The mask time (dsb) is calculated based on at least the second access signal (dsft2) and the data burst length (n). The calculated mask time sufficiently includes the duration of time in which a ringing is present in the DQS signal, so that the disablement of the DQS buffer (330) during the mask time (dsb) prevents a write failure caused by the corrupted DQS signal with the ringing.

The means for disabling the DQS buffer comprises a write command decoder (300); means (310, 320, 350) for generating a number of data length signals (wt_burst0,1,2,3 ... n), after receiving the write command pulse (wtp6) from the write command decoder; and a DQS controller for receiving the data length signals (wt_burst0,1,2,3 ... n) and the second access signal (dsft2) and generating a mask signal (dsb) to the DQS buffer.

The mask signal (dsb) includes a duration of the masking time in which the DQS buffer is to be disabled. The beginning of the masking time is substantially synchronized with the second access signal (dsft2), and the end of the masking time is substantially synchronized with the falling edge of the last data length signal (wt_burstn).

a write command decoder (300) receives the write command and generates a write command pulse (wtp6) based on the write command.

means (310, 320, 350) for generates a number of data length signals (wt_burst0,1,2,3 ... n), after receiving the write command pulse (wtp6) from the write command decoder. The number of generated data length signals (n) equals the number of data bursts (n). The duration in which each data length signal (wt_burst) is enabled equals the total length of the data bursts. A first data length signal (wt_burst0) is enabled by the write command pulse (wtp6). Each of the subsequent data length signals (wt_burst1,2,3 ... or n) is substantially identical to the previous one of the data length signals (wt_burst0,1,2,3 ... or n−1) but delayed by one half clock period (tclk).

a DQS controller for receiving the data length signals (wt_burst0,1,2,3 ... n) and the second access signal (dsft2) and generating a mask signal (dsb) to the DQS buffer. The mask signal (dsb) includes a duration of the masking time in which the DQS buffer is to be disabled. The beginning of the masking time is substantially synchronized with the second access signal (dsft2). The end of the masking time is substantially synchronized with the falling edge of the last data length signal (wt_burstn).

The mask time (dsb) begins when the last pulse of the second access signal (dsft2) is detected. The mask time (dsb) ends after a predetermined delay from the detection of the second access signal (dsft2). The predetermined delay is proportional to the number of data bursts (n) and the period of one clock cycle.

The predetermined delay substantially equals the time of one half period of one clock cycle multiplied by the number of data bursts (n).

The mask time (dsb) begins substantially at the falling edge of the last pulse of the DQS signal. The mask time (dsb) ends after a predetermined delay from the detection of the second access signal (dsft2). The predetermined delay is proportional to the number of data bursts (n) and the period of one clock cycle. The predetermined delay substantially equals the time of one half period of one clock cycle multiplied by the number of data bursts (n).

These and various other features as well as advantages which characterize the present invention will be apparent from a reading of the following detailed description and a review of the associated drawings.

DETAILED DESCRIPTION OF THE PREFERRED EMBODIMENTS

Figure 1A:
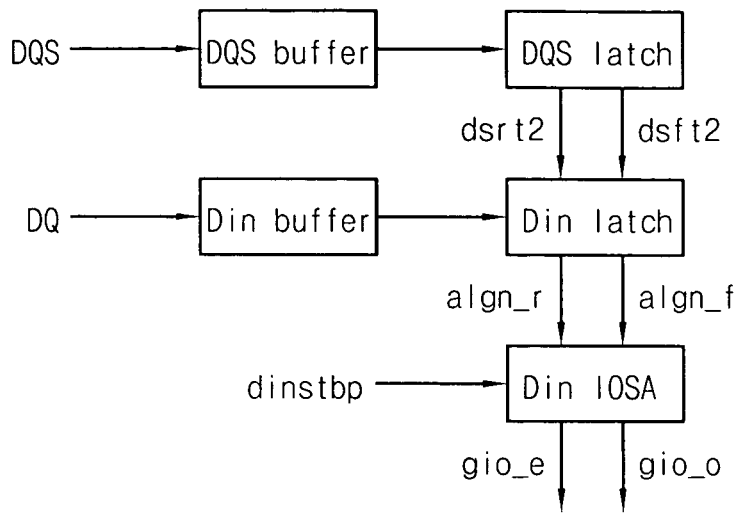
FIG. 1A is a block diagram of a data input part for the write operation in a DDR SDRAM.

Hereinafter, the embodiments of the present invention are described with reference to the accompanying drawings. The same reference numerals are used to indicate the same or similar components in the drawings and the description below.

Figure 3:
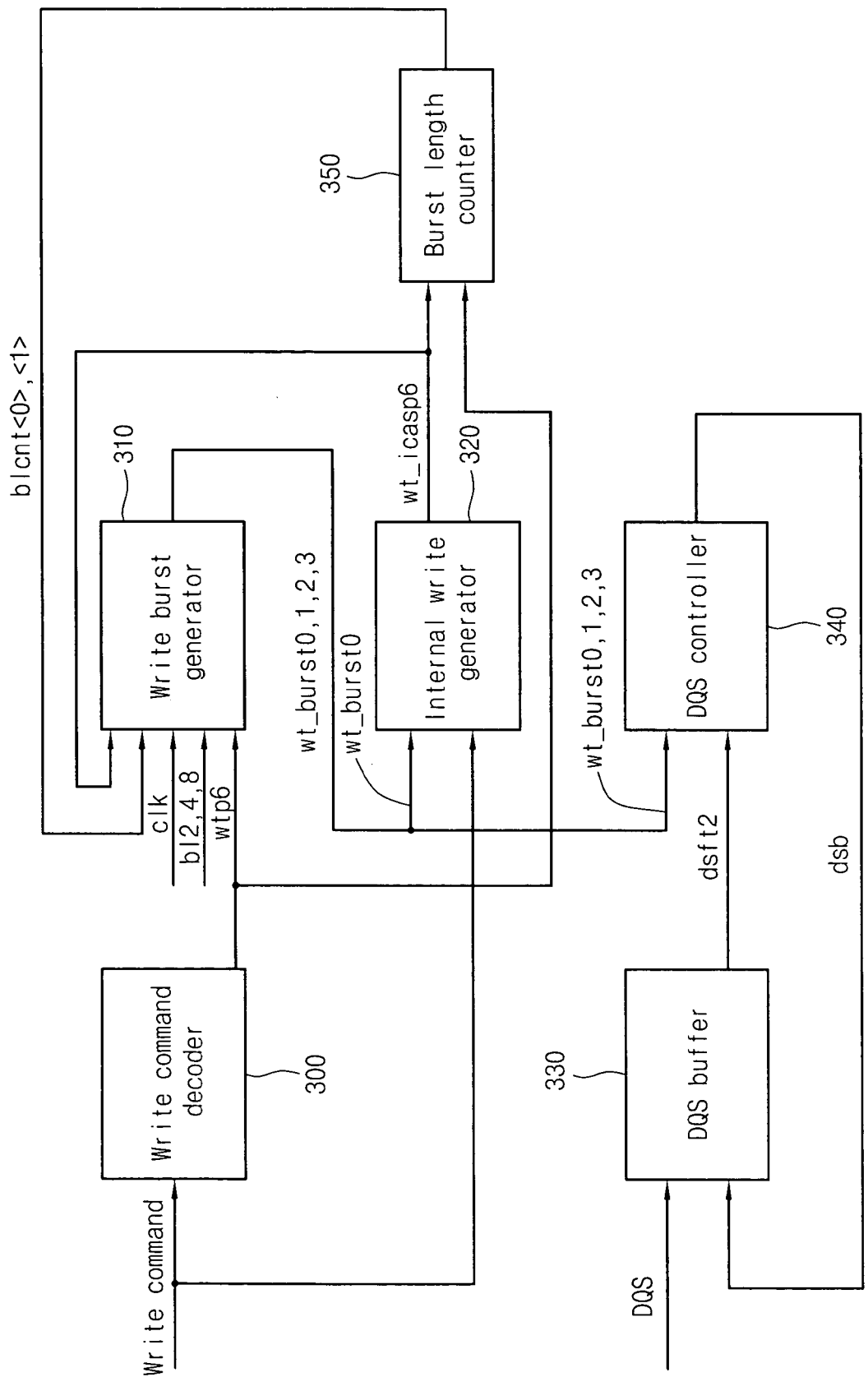
FIG. 3 is a block diagram showing a device for masking a ringing in a DDR SDRAM according to an embodiment of the present invention.

FIG. 3 is a block diagram showing a device for masking a ringing to prevent write fails in a DDR SDRAM according to an embodiment of the present invention.

One important operation of the device as shown in FIG. 3 for masking a ringing is to precalculate a point in time at which the ringing is generated when a write command is issued. This point in time at which the ringing is generated is precalculated according to a burst length (e.g., the burst length may be 2, 4, or 8), and this allows a DQS buffer 330 to be disabled before the ringing is generated. For example, the data bust length of 4 is shown in FIG. 4 by the plurality of data 1st_r, 1st_f, 2nd_r, and 2nd_f.

Figure 1B:
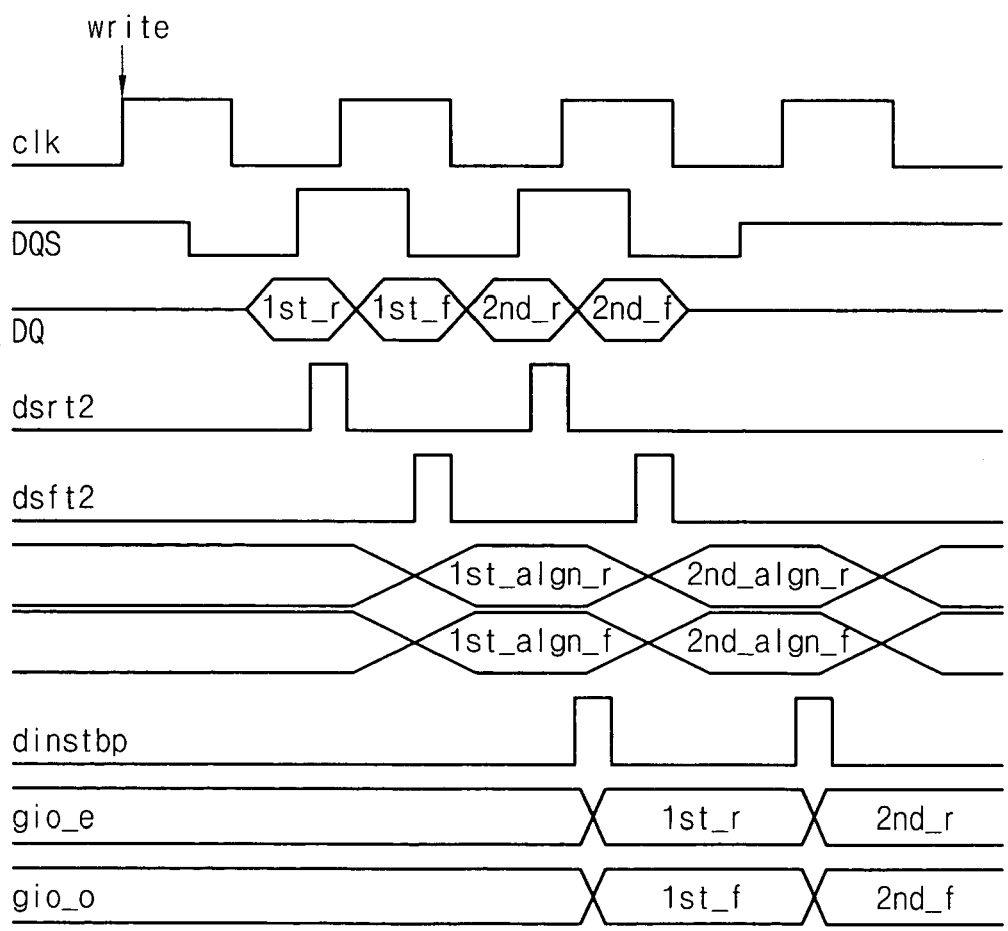
FIG. 1B is a timing chart diagram generally showing the timing of various signals and data transfers in a write operation in a DDR SDRAM.
Figure 2:
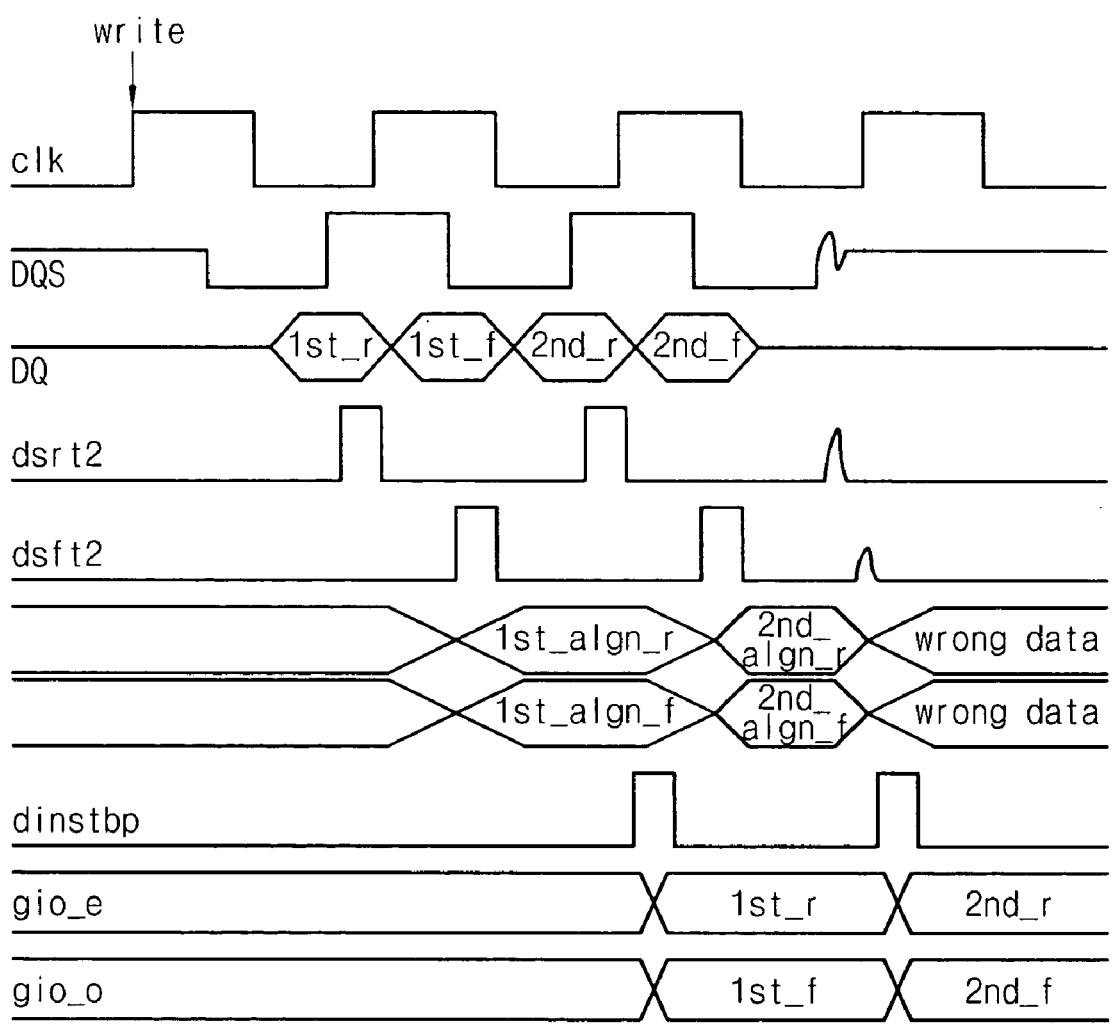
FIG. 2 is a timing chart diagram generally showing the timing of various signals and data transfers in a write operation in a DDR SDRAM in presence of a ringing corrupting the DQS signal.

As shown in FIG. 3, in order to control the DQS buffer 330, the device for masking a ringing includes a write command decoder 300, a write burst generator 310, an internal write generator 320, a burst length counter 350, and a DQS control unit 340. Here, the DQS buffer 330 may be considered as having substantially the similar functions as the DQS buffer 100 of FIG. 1, except that the DQS buffer 330 is under the control of the DQS control unit 340.

Figure 4:
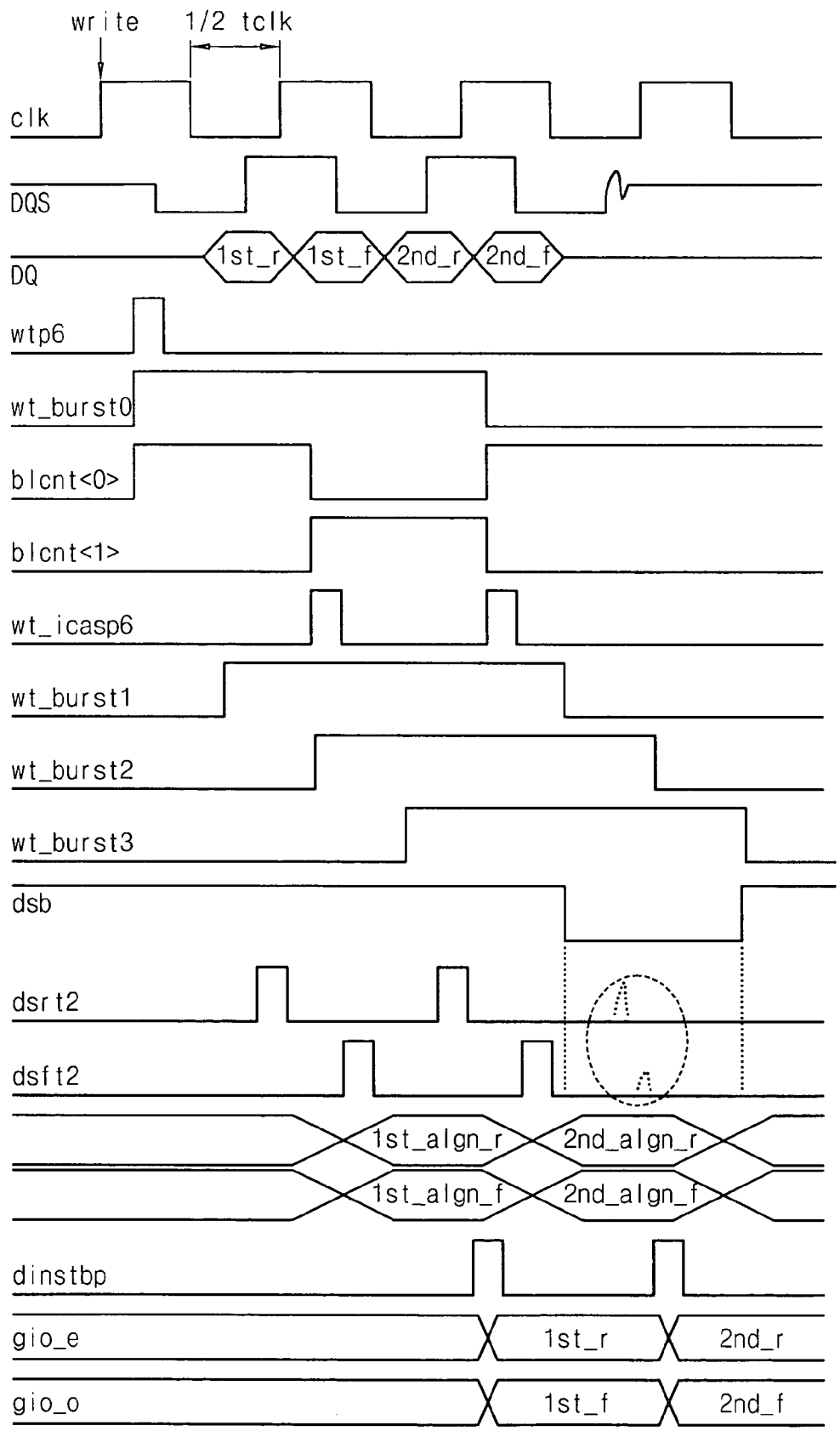
FIG. 4 is a timing chart diagram generally showing the timing of various signals and data transfers in the device of FIG. 3.

Now referring to both FIGS. 3 and 4, the write command decoder 300 determines whether a write command is issued or not by the received signals such as /RAS (a Row Address Strobe), /CAS (a Column Address Strobe), /WE (a Write Enable), clk (a clock signal), etc. The write command decoder 300 generates a pulse signal, wtp6 (also see FIG. 4) when an external command signal is the write command signal.

The write burst generator 310 operates in synchronization with the clock signal, clk. The write burst generator 310 receives the wtp6 pulse signal from the write command decoder 300 to generate a wt_burst0 signal. The wt_burst0 signal, which is generated based on the wtp6 signal, is enabled during the burst length (see FIG. 4). As a result, a period of the wt_burst0 signal varies with the burst length.

The write burst generator 310 receives a signal bl2, bl4, or bl8, which represents the burst length of 2, 4, or 8, respectively.

The internal write generator 320 is enabled by the wt_burst0 signal to generate a wt_icasp6 signal for each rising edge of the clock signal (clk) during when the wt_burst0 signal is high, until a new write command signal is issued (see FIG. 4). In other words, the internal write generator 320 generates the wt_icasp6 pulse signal for every pulse of the clock signal (clk) during when the wt_burst0 signal is enabled at a high level. Therefore, the wt_icasp6 signal is generated in synchronization with the clock signal (clk) while the wt_burst0 signal is enabled For reference, the wt_icasp6 signal is a signal used for counting signals blcnt<0 > and blcnt<1> which will be described later and is generated in synchronization with the clock signal clk while the wt_burst0 signal is enabled.

The burst length counter 350 receives the wt_icasp6 signal and the wtp6 pulse signal to generate the blcnt<0> and blcnt <1> signals, which are the counting signals. More specifically, the blcnt<0> and blcnt<1> signals disable the wt_burst0 signal according to the burst length. An initial value of the blcnt<0> or <1> signal is determined using the wtp6 signal, which is generated on the issuing of a write command as this is already described above. That is, in an embodiment of the present invention as shown in FIG. 4, the initial value of the blcnt<0> signal is a high level, and the initial value of the blcnt<1> signal is a low level.

As described, the wt icasp6 signal is used for generating the counting signals blcnt<0> and blcnt<1>. As shown in FIG. 4, in presence of the first pulse of the wt_icasp6 signal, the blcnt<0> signal goes from high to low and the blcnt<1> signal goes from low to high. Further as shown in FIG. 4, in presence of the second pulse of the wt_icasp6 signal, the blcnt<0> signal goes from low to high and the blcnt<1> signal goes from high to low.

The blcnt<0> or <1> signal is applied to the write burst generator 310 to disable the wt_burst0 signal according to the burst length. For example as shown in FIG. 4, the wt_burst0 signal is generated based on the wtp6 signal and remains high during the burst length. The burst length, however, is determined by the combination of the blcnt<0> and blcnt<1> signals. For example, the wt_burst0 signal is enabled to high when the blcnt<0 > is turned to high, and the wt_burst0 signal is disabled to low as the blcnt<1> is turned to low. In this manner, the wt_burst0 signal is enabled and disabled according to the burst length.

A dsrt2 signal is typically generated in conjunction with each rising edge of the DQS signal, and a dsft2 signal is typically generated in conjunction with the falling edge of the DQS signal. However, unlike the conventional design, the presence of a ringing in the DQS signal does not affect the dsrt2 signal or the dsft2 signal according to an embodiment of the present invention as shown in FIGS. 3 and 4.

The DQS signal is provided to the DQS buffer 330, which in turn generates the dsrt2 and dsft2 signals based on the rising and falling edges of each DQS signal pulse. The dsft2 signal generated by the DQS buffer 330 is received by a DQS controller 340.

The DQS controller 340 then generates a dsb signal based on the dsft2 and other signal conditions. More specifically, the dsb signal typically stays high, but the DQS control unit 340 would disable the dsb signal to a low level if the wt_burst0 signal is disabled to low and the dsft2 signal (which is generated in synchronization with the falling edge of the DQS signal) has changed from high to low.

Here, the DQS control unit 340 receives the wt_burst0, wt_burst1, wt_burt2, and wt_burst3 signals generated from the write burst generator 310 to determine timing at which the dsb signal is disabled to a low level (see FIG. 4). The wt_burst1 signal is obtained by delaying wt_burst0 signal by one half of the clock period (i.e., tclk). The wt_burst2 signal is produced by delaying wt_burst1 by another one half of the clock period (i.e., tclk), and the wt_burst3 signal is obtained by delaying the wt_burst2 signal also by yet additional one half of one clock period, tclk (see FIG. 4).

FIG. 4 is a timing chart of the signals used for the device of FIG. 3. As described above, one important operation of the device according to an embodiment of the present invention is to precalculate a point of time at which ringing is generated according to a burst length (for example, the burst length may be 2, 4, or 8) and to disable a DQS buffer 330 before the ringing generation, when the write command is issued. That is, the DQS controller 340 provides the dsb signal to the DQS buffer 330, the DQS buffer 330 is disabled whenever the dsb signal is low.

For implementation of this, as shown in FIG. 3, a signal wt_burst0 which holds an enable status during a burst length is generated by the write burst generator 310 when the write command is issued. This wt_burst0 signal holds the enable status during the burst length, and the internal write generator 320 and the burst length counter 350 are provided with this wt_burst0 signal.

The dsb signal, which disables the operation of the DQS buffer 330, is disabled (i.e., the dsb value going from high to low) in synchronization with the falling edge of the last pulse of the DQS signal (and/or the last one of the dsft2 signals that are generated according to the falling edges of the DQS signal) and enabled in synchronization with the falling edge of the wt_burst3 signal after the wt_burst0 signal is disabled. Consequently, the output of the DQS buffer 300 is maintained at a low state during a low level of the dsb signal, so that the ringing in the DQS signal, if any, can be effectively masked.

As seen from FIG. 4, since the operation of the DQS buffer is disabled even when the ringing of the DQS signal is generated, glitches are not generated on the dsrt2 and dsrft2 signals. Accordingly, the 2nd_algn_r and 2nd_algn_f data stored in the data latch 130 (as in FIG. 1) are kept in a stable state and then are transferred to the global input/output lines through a detection amplifier in synchronization with the dinstbp signal.

Although the embodiments according to the present invention have been described with reference to the DDR SDRAM, the spirit of the invention described herein can also be applied to QDR SDRAM and XDR SDRAM, which are next generation memory devices, and other various memory devices.

The write malfunction caused by a ringing can be effectively prevented by employing the spirit of the present invention by effectively masking the ringing in DDR SDRAM by means of the control of the DQS buffer.

It will be clear that the present invention is well adapted to attain the ends and advantages mentioned as well as those inherent therein. While a presently preferred embodiment has been described for purposes of this disclosure, various changes and modifications may be made which are well within the scope of the present invention. Numerous other changes may be made which will readily suggest themselves to those skilled in the art and which are encompassed in the spirit of the invention disclosed and as defined in the appended claims.

What is claimed is:

1. A method of masking a ringing in a DQS signal having a finite number of pulses in a memory device including a DDR SDRAM, the method comprising the steps of:
   (a) receiving a DQS signal by a DQS buffer for use within the DDR SDRAM and outputting to a DQS latch;
   (b) receiving data having a plurality of data bursts by a data input buffer and outputting to a data input latch;
   (c) generating a first signal in synchronization with a rising edge of a first pulse of the DQS signal and a second signal in synchronization with a falling edge of the first pulse of the DQS signal,
      wherein the first and second signals are generated by the DQS latch and outputted to the data Input latch;
   (d) storing in the data input latch a first data burst outputted from the data input buffer in synchronization with a rising edge of the first signal;
   (e) storing in the data input latch a second data out outputted from the data input buffer In synchronization with a rising edge of the second signal;
   (f) transferring the first and second data stored in the data input latch to a data input/output detection amplifier (Din IOSA) in synchronization with one of data input strobe pulses; and
   (g) determining a point in time at which a burst length of the data ends and controlling the operations of the DQS buffer to enable or disable the generation of the first and second signals after determining the point in time at which the burst length of the data ends.

2. The method of claim 1, wherein the step (g) comprises the steps of:
   (g-1) generating a first pulse signal when a write command is issued;
   (g-2) generating at least four write burst signals comprising a first to a fourth write burst signals according to the first pulse signal and the burst length, the first burst signal being enabled during the burst length;
   (g-3) generating a second pulse signal in synchronization with a clock signal of the DDR SDRAM while the first write burst signal is enabled;
   (g-4) generating a third pulse signal for disabling the first write burst signal according to the burst length by a combination of the first and second pulse signals;
   (g-5) generating a fourth pulse signal for disabling the operation of the DQS buffer in synchronization with the second signal of step (c) after the first write burst signal is disabled; and
   (g-6) disabling the fourth pulse signal using the second to fourth write burst signals to normally operate the DQS buffer.

3. The method as claimed in claim 2,
   wherein the first write burst signal is enabled during the burst length by a first pulse signal generated in response to the write command.
   wherein the second write burst signal is a signal obtained by delaying the first write burst signal by one half period of the clock signal,
   wherein the third write burst signal is a signal obtained by delaying the second write burst signal by one half period of the clock signal, and
   wherein the fourth, write burst signal is a signal obtained by delaying the third write burst signal by one half period of the clock signal.

4. A device for masking ringing in a DQS signal in a memory device including a DDR SDRAM, comprising:
   a DQS buffer for receiving a DQS signal;
   a DQS latch for storing the DQS signal outputted from the DQS buffer;
   a data buffer for receiving data having a plurality of data bursts;
   a data latch for storing the data transferred from the data buffer; and
   a data input/output detection amplifier for receiving the data stored in the data latch and transferring the received data to global input/output lines; and
   means for controlling the operations of the DQS buffer based on a determined point in time, wherein the determined pointed in time is the point in time at which the burst length ends after receiving a write command.

5. The device as claimed in claim 4, wherein the means for controlling an operation of the DQS buffer comprises:
   a write command decoder for generating a first pulse signal when the write command is issued;
   a write burst generator for generating a first to a fourth write burst signal according to the first pulse signal and the burst length, the first write burnt signal being enabled during the burst length,
   an internal write generator for generating a second pulse signal in synchronization with a clock signal of the DDR SDRAM while the first write burst signal is enabled,
   a burst length counter for generating a third pulse signal, which disables the first write burst signal according to the burst length, by a combination of the first and second pulse signals, and
   a DQS controller for generating a fourth pulse signal, which controls the operation of the DQS buffer, in synchronization with a falling edge of the DQS signal after the first write burst signal is disabled.

6. The device as claimed in claim 5, wherein the first write burnt signal is enabled by the first pulse signal during the burst length, the second write burst signal is a signal obtained by delaying the first write burnt signal by one half period of the clock signal, the third write burst signal is a signal obtained by delaying the second write burst signal by one half period of the clock signal, the fourth write burst signal is a signal obtained by delaying the third write burnt signal by one half period of the clock signal, and the fourth pulse signal is disabled by the second to fourth write burst signals and the DQS buffer normally operates when the fourth pulse signal is disabled.

7. The device as claimed in claim 5, wherein the write burst generator receives the second pulse signal and counts the third pulse signal.

8. A device for masking a ringing in a DQS signal in a memory device including a DDR SDRAM, comprising:
   means for performing a write operation; and
   means for generating a control signal which determines an end point in time of a burst length to disable the operation of a DQS buffer based on the determined point in the time and normally recovers the operation of the DQS buffer after the elapse of a predetermined time, when a write command is issued.
      wherein the means for performing a write operation comprises:
      a DQS buffer for receiving a DQS signal;
      a DQS latch for storing the DQS signal outputted from the DQS buffer;
      a data buffer for receiving data;

a data latch for storing the data transferred from the data buffer; and a data input/output detection amplifier for receiving the data stored in the data latch and transferring the received data to global input/output lines.

9. A method of masking a ringing in a DQS signal in a memory device including a DDR SDRAM having a DQS buffer for receiving and buffering the DQS signal for use within the DDR SORAM, wherein the DQS signal is utilized for accessing data having a burst length, the method comprising the steps of:
(a) determining a point in time at which the burst length ends;
(b) disabling the DQS buffer in response to a first burst signal enabled in a burnt mode operation; and
(c) enabling the DQS buffer in response to a second burst signal enabled in a burst mode operation.

10. In a memory device including a DDR SDRAM that operates at a double data rate by accessing the bursts of data (DQ) having a burst length (n) in accordance with the rising and falling edges of each pulse of a DQS signal, a device for masking a ringing that corrupts the integrity of the DQS signal causing write failures, the device comprising:
a DQS buffer (330) for generating a first access signal (dsrt2) substantially in synchronization with the rising edge of each DQS pulse generated in presence of the data burst (DQ) and for generating a second access signal (dsft2) substantially in synchronization with the falling edge of each DQS pulse generated in presence of the data burst (DQ).
wherein the first access signal (dsrt2) includes a finite number of pulses based on the total number of rising edges of the DQS signal,
wherein the second access signal (dsft2) includes a finite number of pulses based on the total number of falling edges of the DQS signal, and
wherein two consecutive data bursts are accessed together for a write operation for each pair of the consecutive first and second access signals (dsrt2, dsft2); and
means (300, 310, 320, 340, 350) for disabling the DQS buffer for a mask time (dsb) after accessing all data bursts,
wherein the mask time (dsb) is calculated based on at least the second access signal (dsft2) and the data burst length (n), and
further wherein the calculated mask time sufficiently includes the duration of time in which a ringing is present in the DQS signal, so that the disablement of the DQS buffer (330) during the mask time (dsb) prevents a write failure caused by the corrupted DQS signal with the ringing.

11. The device of claim 10, wherein the mask time (dsb) begins when the last pulse of the second access signal (dsft2) is detected.

12. The device of claim 11, wherein the mask time (dsb) ends after a predetermined delay from the detection of the second access signal (dsft2), wherein the predetermined delay is proportional to the number of data bursts (n) and the period of one clock cycle.

13. The device of claim 12, wherein the predetermined delay substantially equals the time of one half period of one clock cycle multiplied by the number of data bursts (n).

14. The device of claim 10, wherein the mask time (dsb) begins substantially at the falling edge of the last pulse of the DQS signal.

15. The device of claim 14, wherein the mask time (dsb) ends after a predetermined delay from the detection of the second access signal (dsft2), wherein the predetermined delay is proportional to the number of data bursts (n) and the period of one clock cycle.

16. The device of claim 15, wherein the predetermined delay substantially equals the time of one half period of one clock cycle multiplied by the number of data bursts (n).

17. The device of claim 10, wherein means for disabling the DQS buffer comprises:
a write command decoder (300) for receiving the write command and generating a write command pulse (wtp6) based on the write command;
means (310, 320, 350) for generating a number of data length signals (wt_burst0,1,2,3 . . . n), after receiving the write command pulse (wtp6) from the write command decoder,
wherein the number of generated data length signals (n) equals the number of data bursts (n);
wherein the duration in which each data length signal (wt_burst) is enabled equals the total length of the data bursts;
wherein a first data length signal (wt_burst0) is enabled by the write command pulse (wtp6); and
wherein each of the subsequent data length signals (wt_burst1,2,3 . . . or n) is substantially identical to the previous one of the data length signals (wt_burst0,1,2,3 . . . or n-1) but delayed by one half clock period (tclk); and
a DQS controller for receiving the data length signals (wt_burst0,1,2,3 . . . n) and the second access signal (dsft2) and generating a mask signal (dsb) to the DQS buffer,
wherein the mask signal (dsb) includes a duration of the masking time in which the DQS buffer is to be disabled,
wherein the beginning of the masking time is substantially synchronized with the second access signal (dsft2), and
further wherein the end of the masking time is substantiaily synchronized with the falling edge of the last data length signal (wt_burstn).

18. The device of claim 17, wherein the mask time (dsb) begins when the last pulse of the second access signal (dsft2) is detected.

19. The device of claim 18, wherein the mask time (dab) ends after a predetermined delay from the detection of the second access signal (dsft2), wherein the predetermined delay is proportional to the number of data bursts (n) and the period of one clock cycle.

20. The device of claim 19, wherein the predetermined delay substantially equals the time of one half period of one clock cycle multiplied by the number of data bursts (n).

21. The device of claim 17, wherein the mask time (dsb) begins substantially at the falling edge of the last pulse of the DQS signal.

22. The device of claim 18, wherein the mask time (dsb) ends after a predetermined delay from the detection of the second access signal (dsft2), wherein the predetermined delay is proportional to the number of data bursts (n) and the period of one clock cycle.

23. The device of claim 19, wherein the predetermined delay substantially equals the time of one half period of one clack cycle multiplied by the number of data bursts (n).

24. In a memory device including a DDR SDRAM that operates at a double data rate by accessing the bursts of data (DQ) having a burst length (n) in accordance with the rising and falling edges of each pulse of a DQS signal, a method of masking a ringing that corrupts the integrity of the DQS signal causing write failures, the method comprising the steps of:

generating a first access signal (dsrt2) substantially in synchronization with the rising edge of each DQS pulse generated in presence of the data burst (DQ);

generating a second access signal (dsft2) substantially in synchronization with the falling edge of each DQS pulse generated in presence of the data burst (DQ), wherein the first access signal (dsrt2) includes a finite number of pulses based on the total number of rising edges of the DQS signal, wherein the second access signal (dsft2) includes a finite number of pulses based on the total number of falling edges of the DQS signal, and wherein two consecutive data bursts are accessed together for a write operation for each pair of the consecutive first and second access signals (dsrt2, dsft2); and after accessing all data bursts, generating no additional first and second access signals (dsrt2, dsft2) for a calculated mask time (dsb), wherein the mask time (dsb) is calculated based on at least the last pulse of the already generated second access signal (dsft2) and the data burst length (n), and further wherein the calculated mask time sufficiently includes the duration of time in which a ringing is present in the DQS signal, so that by not generating the additional first and second access signals (dsft2, dsrt2) during the mask time (dsb), a write failure caused by the corrupted DQS signal is prevented.

25. The method of claim 24, wherein the mask time (dsb) begins when the last pulse of the second access signal (dsft2) is detected.

26. The method of claim 25, wherein the mask time (deb) ends after a predetermined delay from the detection of the second access signal (dsft2), wherein the predetermined delay is proportional to the number of data bursts (n) and the period of one clock cycle.

27. The method of claim 26, wherein the predetermined delay substantially equals the time of one half period of one clock cycle multiplied by the number of data bursts (n).

28. The method of claim 24, wherein the mask time (dsb) begins substantially at the falling edge of the fast pulse of the DQS signal.

29. The method of claim 28, wherein the mask time (dsb) ends after a predetermined delay from the detection of the second access signal (dsft2), wherein the predetermined delay is proportional to the number of data bursts (n) and the period of one clock cycle.

30. The method of claim 29, wherein the predetermined delay substantially equals the time of one half period of one clock cycle multiplied by the number of data bursts (n).

31. The method of claim 24, wherein the method of generating no additional first and second access signals (dsrt2, dsft2) for a calculated mask time (dsb) after accessing all data bursts further comprises steps of:

receiving a write command;

generating a write command pulse (wtp6) based on the write command;

generating a number of data length signals (wt_burst0,1, 2,3 . . . n-1), after receiving the write command pulse (wtp6) from a write command decoder.

wherein the number of generated data length signals (n) equals the number of data bursts (n);

wherein the duration in which each data length signal (wt_burst) is enabled equals the total length of the data bursts;

wherein a first data length signal (wt_burst0) is enabled by the write command puise (wtp6); and wherein each of the subsequent data length signals (wt_burst1,2,3 . . . or n-1) is substantially identical to the previous one of the data length signals (wt_burst0,1,2,3 . . . or n-2) but delayed by a one half clock period (tclk); and generating a mask signal (dsb) based on the data length signals (wt_burst0,1,2,3 . . . n) and the second access signal (dsft2), wherein the beginning of the masking time is substantially synchronized with the last pulse of the second access signal (dsft2), and further wherein the end of the masking time is substantially synchronized with the falling edge of the last data length signal (wt_burstn-1).

* * * * *